(12) United States Patent
Im et al.

(10) Patent No.: US 9,401,487 B2
(45) Date of Patent: Jul. 26, 2016

(54) CHANNEL LAYER FOR STRETCHABLE TRANSISTORS

(71) Applicants: Samsung Electronics Co., Ltd., Suwon-si (KR); Industry-Academic Cooperation Foundation, Yonsei University, Seoul (KR)

(72) Inventors: Jung-kyun Im, Yongin-si (KR); Jong-jin Park, Hwaseong-si (KR); Min-woo Park, Seoul (KR); Min-kwan Shin, Seoul (KR); Un-yong Jeong, Seoul (KR)

(73) Assignees: SAMSUNG ELECTRONICS CO., LTD., Suwon-si (KR); Industry-Academic Cooperation Foundation, Yonsei University, Seoul (KR)

( * ) Notice: Subject to any disclaimer, the term of this patent is extended or adjusted under 35 U.S.C. 154(b) by 114 days.

(21) Appl. No.: 14/077,444

(22) Filed: Nov. 12, 2013

(65) Prior Publication Data

US 2014/0131685 A1    May 15, 2014

(30) Foreign Application Priority Data

Nov. 12, 2012    (KR) .................. 10-2012-0127736

(51) Int. Cl.
*H01L 51/00* (2006.01)
*H01L 51/05* (2006.01)

(52) U.S. Cl.
CPC ......... *H01L 51/0566* (2013.01); *H01L 51/0094* (2013.01); *H01L 51/0097* (2013.01)

(58) Field of Classification Search
CPC ............ H01L 51/0028; H01L 51/0035; H01L 51/0036; H01L 51/0094; H01L 51/0097; H01L 51/0566

USPC ................................................. 257/40; 438/99
See application file for complete search history.

(56) References Cited

U.S. PATENT DOCUMENTS

| | | | |
|---|---|---|---|
| 7,557,367 B2 | 7/2009 | Rogers et al. | |
| 8,217,381 B2 | 7/2012 | Rogers et al. | |
| 2005/0121728 A1* | 6/2005 | Bao | 257/369 |
| 2006/0214156 A1* | 9/2006 | Pan et al. | 257/40 |
| 2010/0273049 A1 | 10/2010 | Vidal et al. | |
| 2013/0001525 A1* | 1/2013 | Hu et al. | 257/40 |

FOREIGN PATENT DOCUMENTS

| | | |
|---|---|---|
| KP | 10-2006-0125620 A | 12/2006 |
| KR | 10-2004-0047978 A | 6/2004 |
| KR | 10-2007-0105237 A | 10/2007 |

OTHER PUBLICATIONS

Chan Yan, et al.; "Graphene-based flexible and stretcchable thin film transistors"; Nanoscale, The Royal Society of Chemistry; May 24, 2012; vol. 4, pp. 4870-4882.

* cited by examiner

*Primary Examiner* — Jae Lee
*Assistant Examiner* — Colleen E Snow
(74) *Attorney, Agent, or Firm* — Sughrue Mion, PLLC

(57) ABSTRACT

Provided are a material for forming a channel layer for a stretchable TFT, a method of preparing a channel layer for a stretchable TFT, a channel layer for a stretchable TFT, and a stretchable TFT. The material for forming the channel layer for the stretchable TFT includes an elastomer, an organic semiconductor material and a solvent. By mixing an elastomer and an organic semiconductor material and forming a thin film, a channel layer having an excellent conductivity and stretchability may be obtained.

16 Claims, 5 Drawing Sheets

CHANNEL LAYER FOR STRETCHABLE TRANSISTORS

CROSS-REFERENCE TO RELATED APPLICATIONS

This application claims priority from Korean Patent Application No. 10-2012-0127736, filed on Nov. 12, 2012 in the Korean Intellectual Property Office, the disclosure of which is incorporated herein in its entirety by reference.

BACKGROUND

1. Field

The present disclosure relates to stretchable channel composites capable of being used as channel materials for transistors and methods of preparing the stretchable channel composites. The provided channel composites are stretchable and may be used for stretchable transistors. Also, the provided channel composites may be applied in robotic sensory skins, electronic textiles, and implantable medical devices.

2. Description of the Related Art

Most electronic devices are based on a silicon substrate. Methods of silicon growth are well established and a silicon substrate may be manufactured by a simple manufacturing process. A thin film transistor (TFT) is an active element and is a necessary component in a display device. As such, a TFT will be a necessary component in various next-generation applied fields requiring transparency, flexibility, and stretchability. Accordingly, TFTs represent a very important field of technology requiring continuous research and development. In a TFT, an improved silicon substrate, such as an amorphous silicon substrate, a low temperature poly silicon substrate (LTPS), or the like may be used. Unfortunately, however, typical inorganic materials generally fracture or transform under a strain of about 1%. Likewise, a silicon substrate, such as an amorphous silicon substrate or a LTPS, fracture or transform under a strain of about 1%. Accordingly, a silicon (Si)-type traditional material is not used in stretchable electronics.

In a the future, various forms of display devices (for example, a transparent displaying device or a flexible display device that can be attached to a wide wall, a curved pillar, or a ceiling) will play a very important role. By using a bendable plastic substrate and an easily-produced organic thin film, various forms of flexible devices may be manufactured at low cost. Plastic substrates and organic thin films are foundations of organic electronics. Also, in order to obtain a stretchable TFT, an approach through organic electronics is needed.

Stretchable electronics may be divided into a number of categories. The most technically useful electronics are applied products that are strong against stress and are slightly bendable. The next challenge is to produce bendable and rollable devices; the most difficult challenge is to produce foldable and stretchable devices into a desired form. Here, a technical issue to be considered is the mechanical strain applied to the substrate or to a deposited thin film. The strain that arises when a substrate having a thickness of L is bent with a radius of curvature R is defined as L/2R. When the substrate is folded, the strain applied to the substrate may increase greater than by ten times compared to when the substrate is simply bent. When the substrate is stretched or transformed into a desired form, the strain may increase up to 100%. Depending on the degree of applied strain, different measures need to be taken, and the thus the goal of the stretchable electronics field is to use suitable organic materials.

Other advantages that arise when organic materials are used include that various printing methods become available, as well as low processing temperature and solution processing. Hence, when equipment having numerous vacuum devices is replaced with a simple solution process or a printing process, it is possible to substantially reduce manufacturing costs.

However, pre-existing organic semiconductor materials that may be used for a channel layer of a TFT are either not stretchable or are very weak. P3HT(poly(3-hexyl thiophene)) is representative of such organic semiconductor materials. Regarding P3HT, when elongation is 3%, conductivity is reduced substantially as the number of stretches increases, and when elongation reaches 5%, the conductivity disappears after only one stretch.

SUMMARY

One or more embodiments provide materials for forming channel layers for stretchable thin film transistors (TFT).

One or more embodiments also provide methods of forming channel layers for stretchable TFTs One or more embodiments also provide channel layers for forming stretchable TFTs.

One or more embodiments also provide stretchable TFTs.

According to an aspect of an embodiment, there is provided there is provided a material for forming a channel layer for a stretchable TFT including an elastomer, an organic semiconductor material, and a solvent.

According to an aspect of another embodiment, there is provided a method of forming a material for forming a channel layer for a stretchable TFT, the method including: coating the material for forming the channel layer for the stretchable TFT (hereinafter, referred to as a 'material') including the elastomer, the organic semiconductor material, and the solvent on a substrate to form an applied material layer; removing the solvent from the applied material layer and forming a stabilized material layer; and annealing the stabilized material layer, phase separating the organic semiconductor material from the elastomer, at least on a surface of the stabilized material layer, thereby forming a channel layer.

According to an aspect of another embodiment, there is provided a channel layer for a stretchable TFT including an elastomer matrix and an organic semiconductor material network mixed into the elastomer matrix such that it is present on at least a surface of the elastomer matrix.

According to an aspect of another embodiment, there is provided a stretchable TFT including an elastomer matrix and an organic semiconductor material network included on at least a surface of the elastomer matrix.

By mixing the elastomer and the organic semiconductor material and forming a thin film, a channel layer having excellent conductivity and stretchability may be obtained.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION

Figure 1:
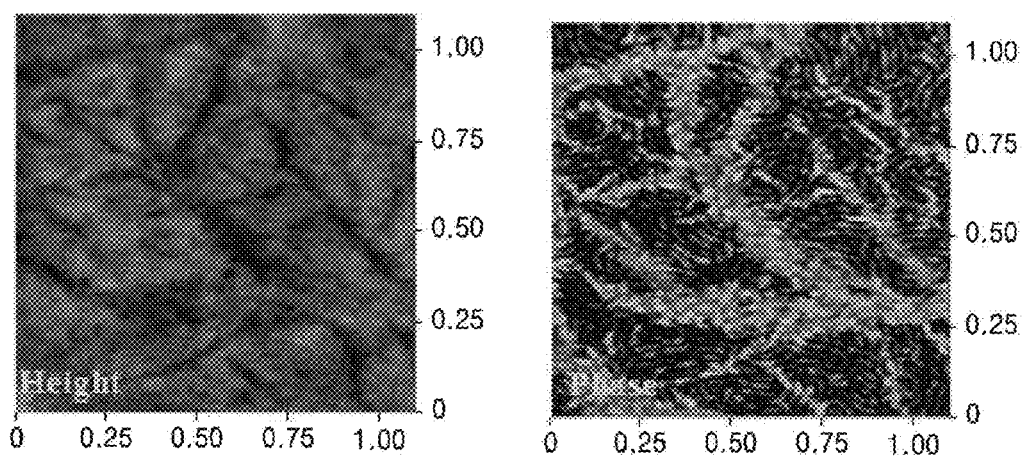
FIG. 1 is an Atomic Force Microscope (AFM) image of a top surface (a surface that does not contact polydimethylsiloxane (PDMS)) of a channel layer included in the PDMS-channel layer obtained in Example 1.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments herein are merely described below, by referring to the figures, in order to explain aspects of the present disclosure.

An embodiment of a material for forming a channel layer for a stretchable thin film transistor (TFT) according to an aspect herein includes an elastomer, an organic semiconductor material, and a solvent.

The elastomer may be, for example, a polybutadiene (PB)-based resin, a styrene-butadiene copolymer, a styrene-butadiene-styrene copolymer (SBS), a styrene-ethylene-butylene-styrene copolymer (SEBS), an ethylene propylene diene rubber (EPDM), an acrylic rubber, a polychloroprene rubber (CR), a polyurethane (PU)-based resin, a fluoro-rubber, a butyl rubber, or a combination thereof. If the molecular weight of the elastomer is too small, the inherent properties of the polymer may be lost. If the molecular weight of the elastomer is too big, synthesis becomes too difficult and the elastomer may not dissolve in the solvent. A weight-average molecular weight of the elastomer may be about 65,470 g/mol to about 172,300 g/mol.

The organic semiconductor material may be an n-type or a p-type. The n-type semiconductor material may be, for example, poly(benzimidazobenzophenanthroline), poly(2,5-di(hexyloxy)cyanoterephthalylidene), or a combination thereof. The p-type organic semiconductor material may be, for example, poly(3-hexylthiophene-2,5-diyl) (P3HT), poly(quaterthiophene) (POT), poly(2,5-bis(3-alkylthiophen-2-yl)thieno[3,2-b]thiophene) (PBTTT), (Poly[bis(4-phenyl)(2,4, 6-trimethylphenyl)amine (PTAA), 6,13-bis (triisopropylsilyethylnyl)pentacene (TIPS pentacene), or a combination thereof. An n-type organic semiconductor material tends to have difficulty in matching a metal electrode material to a work function. At the point of contact between the n-type semiconductor material and a metal, a retention insulator exists and accordingly, contact resistance tends to increase at the point of contact between the n-type semiconductor material and the metal. Accordingly, as an organic semiconductor material, using a p-type organic semiconductor material is more desirable.

As the solvent, any solvent capable of simultaneously dissolving the elastomer and the organic semiconductor material may be used. The solvent may be, for example, chloroform, chlorobenzene, toluene, dimethylformaldehyde, tetrahydrofuran, dimethyl sulfoxide, N-methylpyrrolidone, xylene, or a combination thereof.

The amount of elastomer in the material for forming the channel layer for the stretchable TFT may be determined based on the organic semiconductor material. If the amount of elastomer is too small as compared to that of the organic semiconductor material, the stretchability may decrease, and if the amount is too large, the conductivity may decrease. The amount of the elastomer in the material for forming the channel layer for the stretchable TFT may be from about 0.1 part by weight to about 1 part by weight based on 100 parts by weight of the organic semiconductor material.

The amount of solvent in the material for forming the channel layer for the stretchable TFT may be determined based on the total weight of the organic semiconductor material and the elastomer. If the amount of solvent is too small as compared to the total weight of the organic semiconductor material and the elastomer, then dissolution may not be completed, and if the amount is too large, then a thin film may not form well. The amount of solvent for forming the channel layer for the stretchable TFT may be, for example, from about 90.00 parts by weight to about 99.00 parts by weight, or from about 98.00 parts by weight to about 98.75 parts by weight, based on 100 parts by weight of the total weight of organic semiconductor material and the elastomer.

When the viscosity of the material for forming the channel layer for the stretchable TFT is too low, the resulting thin film may be too thin and may crack, and if the viscosity is too high, a thin film may not form at all. The viscosity of the material for forming the channel layer for the stretchable TFT may be, for example, from about 1.08 cps to about 2.0 cps. The viscosity may be controlled by changing the amount of solvent used. As mentioned above, the amount of solvent in the material for forming the channel layer for the stretchable TFT used in order to achieve the viscosity above may be, for example, from about 90.00 parts by weight to about 99.00 parts by weight, or from about 98.00 parts by weight to about 98.75 parts by weight based on 100 parts by weight of the total weight of the organic semiconductor material and the elastomer.

According to another aspect herein, there is a method of preparing the channel layer for the stretchable TFT, the method including: coating the material for forming the channel layer for the stretchable TFT (hereinafter, referred to as a 'material') including the elastomer, the organic semiconductor material, and the solvent on a substrate to form an applied material layer; removing the solvent from the applied material layer and forming a stabilized material layer; and annealing the stabilized material layer, phase separating the organic semiconductor material from the elastomer, at least on a surface of the stabilized material layer, thereby forming a channel layer.

The substrate may be flexible or non-flexible. A flexible substrate may be, for example, a paper, a resin, or a combination thereof. The substrate may have a thickness in a range of from about 50 µm to about 1,000 µm.

The paper may be plant fiber that is dehydrated and dried after having been dissolved in water to make the plant fiber entangle in a thin and flat manner. The paper substrate may be, for example, a natural fiber produced from timber pulp, linen, ramie, hemp, or wool; vinylon, nylon, acryl, rayon, polypropylene, or a chemical fiber produced from an asbestos fiber, or a combination thereof.

The paper substrate may further include a capping layer. The capping layer may be formed on at least one surface of the paper substrate. The capping layer may provide further mechanical strength, chemical stability and flatness to the paper substrate. The capping layer may include, for example, a polymer film. The polymer film of the capping layer may include, for example, acryl, polyimide, bis-benzocyclobutene (BOB), or perfluorocyclobutane (PFCB). The capping layer may have a thickness in a range of from about 1 μm to about 10 μm.

The resin substrate may be, for example, a plastic resin, a thermosetting resin, or an elastomer. The plastic resin may be, for example, a polyvinyl resin, a polystyrene-based resin, an acryl resin, an ABS resin, a polyester resin, or a combination thereof. The thermosetting resin may be, for example, a phenol resin, a urea resin, a melamine resin, an epoxy resin, or a combination thereof. The elastomer may be, for example, a polydimethylsiloxane-based resin, a natural rubber, a polyurethane-based resin, or a combination thereof.

The resin substrate may be a laminated plastic film. A laminated plastic substrate may include, for example, a first outer layer, a second outer layer, and an intermediate layer disposed between the first outer layer and the second outer layer. The first outer layer and the second outer layer may be a film of, for example, polyphenylene oxide, polyethylene terephthalate, polybutylene terephthalate, polydihydroxymethylcyclohexyl terephthalate, cellulose ester, polycarbonate, polyamide, or polyimide. The first outer layer and the second outer layer may be the same or different. The first outer layer and the second outer layer may have adhesive properties and hydrophobicity. The second outer layer may include a film having hydrophobicity. The second outer layer may include, for example, a film having hydrophobicity such as polytetrafluoroethylene (PTFE). The second outer layer may prevent moisture penetration while maintaining flexibility. The intermediate layer may be a pre-preg film where a resin is impregnated on a reinforced fiber. The resin of the intermediate layer may be, for example, a polyester-based resin, an acrylate-based resin, or a combination thereof. The reinforced fiber of the intermediate layer may include, for example, a glass fiber, a silica fiber, and the like. The intermediate layer including the pre-preg film may increase the mechanical strength of the laminated plastic substrate. In another embodiment, the intermediate layer may be a polyimide film or a polyethylene naphthalate film.

The plastic substrate may further include a capping layer on an outermost surface thereof. The capping layer may provide to the substrate further flatness and an insulating barrier with respect to, for example, moisture. The capping layer may include, for example, $SiO_2$, SiON, SiN, fluorinated silica glass (FSG), hydrogensilsesquioxane (HSQ), methylsilsesquioxane (MSQ), bis-benzocyclobutene (BCB), poly arylene ether (PAE), or hybrid-organo-siloxane polymer (HOSP). The capping layer may have a thickness in the range of from about 1 μm to about 10 μm.

The substrate may be a substrate on which a source electrode and a drain electrode are formed. In this case, the material is coated on the source electrode or the drain electrode. The source electrode or the drain electrode may include a metal, a metal oxide thin film, or a conductive polymer. The metal may be, for example, gold (Au), silver (Ag), chromium (Cr), titanium (Ti), copper (Cu), aluminum (Al), tantalum (Ta), molybdenum (Mo), tungsten (W), nickel (Ni), palladium (Pd), platinum (Pt), an alloy thereof, or a mixture thereof. The metal oxide thin film may include, for example, indium tin oxide (ITO), indium zinc oxide (IZO), or the like. The conductive polymer may include, for example, polyethylene dioxythiophene: polystyrene sulphonate (PEDOT:PSS), polyaniline, polypyrrol, or a mixture thereof. The source electrode or the drain electrode may have a thickness in a range of from about 10 nm to about 200 μm.

Coating the material on the substrate may be performed by, for example, spin coating, spray coating, deep coating, roll coating, or the like. The thickness of the coated material may be suitably selected by considering the desired thickness of the stabilized material layer after removal of the solvent.

Forming the stabilized material layer is performed by removing the solvent from the coated material layer. The solvent may be removed from the coated material layer by, for example, volatilization, evaporation, or vaporization. Removing the solvent may be performed under atmospheric pressure or reduced pressure. If the speed of removing the solvent is too fast, the formation of a uniform material layer may be difficult to achieve. The speed of the solvent removal depends on temperature and pressure. In general, the speed of removing the solvent increases as the temperature increases and the pressure decreases. If the temperature of removing the solvent is too low or if the pressure is too high, the speed of removing the solvent decreases substantially and thus may decrease productivity. If the temperature for removing the solvent is too high or the pressure is too low, the speed of removing the solvent may become too fast. A temperature for removing the solvent that is lower than the boiling point of the solvent may be advantageous. For example, in general, the temperature for removing the solvent may be from about 25° C. to about 50° C. Under reduced pressure, a lower temperature for removing the solvent may be selected.

Forming a channel layer may be performed by annealing the stabilized material layer. In the annealing process, the organic semiconductor material phase separates from the elastomer at least on a surface of the stabilized material layer.

If the annealing temperature of the stabilized material layer is too low, phase separation may not occur, and if the annealing temperature is too high, an unstable phase separation may occur. An annealing temperature of the stabilized material layer that is higher than the higher of the value of the glass transition temperature of the semiconductor material and the glass transition temperature of the elastomer is desirable. For example, the annealing temperature of the stabilized material layer may be greater by from about 0° C. to about 50° C. than the higher of the value of the glass transition temperature of the semiconductor material and the glass transition temperature of the elastomer.

A phase separated organic semiconductor material may have a shape of two separated regions. Primary factors affecting phase separation are the annealing temperature and the affinity between two polymer materials. The location of the phase separation is concentrated on the surface of the stabilized material layer because the surface energy of the layer is higher on the surface.

Regarding the channel layer formed above, the elastomer phase acts as a matrix providing mechanical strength, flexibility, and stretchability, while the organic semiconductor material phase acts as an electroconductive network providing electroconductivity to the channel layer. Surprisingly, regarding the channel layer formed above, an organic semiconductor material network included in an elastomer matrix is able to maintain excellent electroconductivity even after elongation of the channel layer. This is in stark contrast to a channel layer composed of only an organic semiconductor material that loses substantial electroconductivity after an elongation.

If the thickness of the channel layer formed above is too thin, there may be a problem in maintaining electroconductivity. If the thickness of the channel layer formed above is too thick, there may be a problem in stability. The thickness of the channel layer formed is from about 0.02 μm to about 0.05 μm.

The channel layer for the stretchable TFT, according to another aspect herein, includes an elastomer matrix and the organic semiconductor material network included at least on a surface of the elastomer matrix.

The elastomer may be, for example, a polybutadiene (PB), a styrene-butadiene copolymer, a styrene-ethylene-butylene-styrene copolymer (SBS), a styrene-ethylene-butylene-styrene copolymer (SEBS), an ethylene propylene diene rubber (EPDM), an acrylic rubber, a polychloroprene rubber (CR), a polyurethane (PU), a fluoro-rubber, a butyl rubber, or a combination thereof. If the molecular weight of the elastomer is too small, the elastomer may lose the inherent properties of the polymer. If the molecular weight of the elastomer is too large, synthesis may become difficult and the elastomer may not dissolve in a solvent. The weight average molecular weight of the elastomer may be, for example, from about 65,470 g/mol to about 172,300 g/mol.

The organic semiconductor material may be an n-type or a p-type. The n-type organic semiconductor material may be, for example, Poly(benzimidazobenzophenanthroline), poly(2,5-di(hexyloxy)cyanoterephthalylidene), or a combination thereof. The p-type organic semiconductor material may be, for example, poly(3-hexylthiophene-2,5-diyl) (P3HT), poly(quaterthiophene) (PQT), poly(2,5-bis(3-alkylthiophen-2-yl)thieno[3,2-b]thiophene) (PBTTT), Poly[bis(4-phenyl)(2,4,6-trimethylphenyl)amine](PTAA), 6,13-bis(triisopropylsilyethylnyl)pentacene (TIPS pentacene), or a combination thereof. An n-type organic semiconductor material tends to have difficulty matching a metal electrode material to a work function. At the point of contact between the n-type semiconductor material and a metal, a retention barrier exists and accordingly, contact resistance tends to increase at the point of contact between the n-type semiconductor material and the metal. Accordingly, as an organic semiconductor material, use of the p-type organic semiconductor material is more desirable.

The amount of elastomer in the material for forming the channel layer for the stretchable TFT may be determined based on the organic semiconductor material. If the amount of the elastomer is too small as compared to that of the organic semiconductor material, stretchability may decrease, and if the amount is too large, conductivity may decrease. The amount of the elastomer in the material for forming the channel layer for the stretchable TFT may be from about 0.1 part by weight to about 1 part by weight based on 100 parts by weight of the organic semiconductor material.

If the thickness of the channel layer formed above is too thin, there may be a problem in maintaining electroconductivity. If the thickness of the channel layer formed above is too thick, there may be a problem in stability. The thickness of the channel layer formed may be from about 0.02 µm to about 0.05 µm.

Regarding the channel layer formed above, the elastomer phase acts as a matrix providing mechanical strength, flexibility, and stretchability, while the organic semiconductor material phase acts as an electroconductive network providing electroconductivity to the channel layer. Surprisingly, regarding the channel layer formed above, an organic semiconductor material network included in an elastomer matrix is able to maintain excellent electroconductivity even after elongation of the channel layer. This is in stark contrast to a channel layer composed only of an organic semiconductor material that loses substantial electroconductivity after elongation.

According to another aspect herein, provided is a TFT having a channel layer including the elastomer matrix and the organic semiconductor material network included at least on a surface of the elastomer matrix.

EXAMPLE 1

Example 1

Preparing a TFT Including a Stretchable Channel Layer

In a 0.125 wt % solution of P3HT in m-xylene (manufactured in the United States, manufactured by Sigma Aldrich, product name: P3HT, product weight: 1 g) SEBS (manufactured in the United States, manufactured by Polymer Science, product name: SEBS, product weight: 1 g) was added such that the weight ratio of SEBS:P3HT was 200:1 to prepare a material for forming a channel layer (hereinafter referred to as a material). A cured polydimethylsiloxane (PDMS) substrate (manufactured in the United States, manufactured by Dow Corning, product name: Sylgard 184, product weight: 500 g) was activated by an $O_2$ plasma and the material was spin coated on the substrate. The material coated on the PDMS substrate was heated at a temperature of 150° C., which 20° C. is higher than the glass transition temperature of P3HT (glass transition temperature: 130° C.) and the glass transition temperature of SEBS (glass transition temperature: −55° C.) for 0.5 hour, xylene was removed and a stabilized material layer was annealed simultaneously thus obtaining a channel layer formed on the PDMS substrate. The thickness of the channel layer was 0.02 µm. To manufacture a substrate for TFT having a bottom gate form, 200 nm of $SiO_2$ insulator was deposited on a Si wafer. Thereafter, the insulator was etched so as to have the same pattern as the pattern of the electrode and so form an etched insulator. On the etched insulator, gold was deposited to form a source electrode and a drain electrode. As a result, a substrate for TFT having a floor gate form was obtained. On the substrate for TFT, the PDMS-channel layer was attached. Here, the channel layer was arranged so as to contact the source electrode and the drain electrode. As a result, a TFT including the PDMS-channel layer was obtained.

Observing Phase Separation of the Channel Layer

Figure 2:
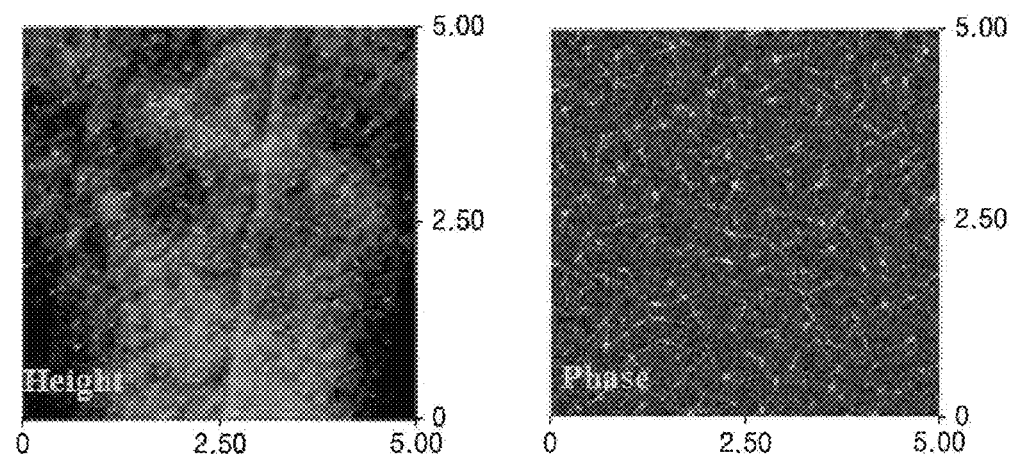
FIG. 2 is an AFM image of a bottom surface (a surface that contacts the PDMS) of a channel layer included in the PDMS-channel layer obtained in Example 1.
Figure 3:
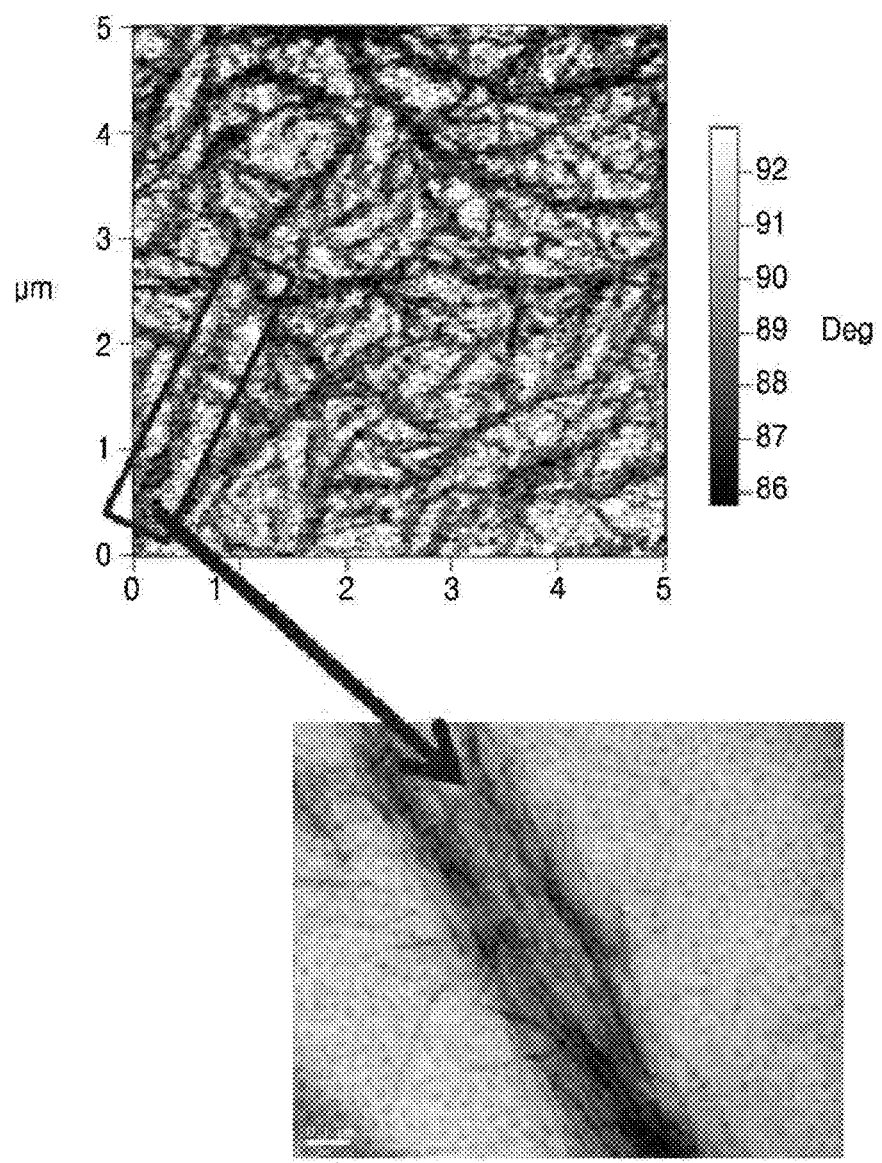
FIG. 3 is a scanning electron microscope image of the top surface of the channel layer of Example 1

FIG. 1 is an Atomic Force Microscope (AFM) image of a top surface (i.e., a surface that does not contact the PDMS) of a channel layer included in the PDMS-channel layer obtained in Example 1. FIG. 2 is an AFM image of a bottom surface of the channel layer included in the PDMS-channel layer obtained in Example 1. As illustrated in FIG. 1, phase separation occurred on the top surface of the channel layer between two polymers (here, P3HT and SEBS). As illustrated in FIG. 2, on the bottom surface of the channel layer, P3HT was almost non-existent and only SEBS was present. Referring to the height image of FIG. 1, P3HT was low and SEBS was slightly higher, suggesting that the SEBS covered the P3HT. FIG. 3 is a scanning electron microscope image of the top surface of the channel layer of Example 1. In FIG. 3, the black lines are P3HT. As can be seen, the P3HT fibers exist in an aggregated bundle form. Hence, the bundle of fibers of P3HT that phase separated from the SEBS forms a network. Accordingly, despite including an insulating SEBS as a matrix, the channel layer may maintain electroconductivity.

Transfer Characteristics of the Channel Layer

Figure 4:
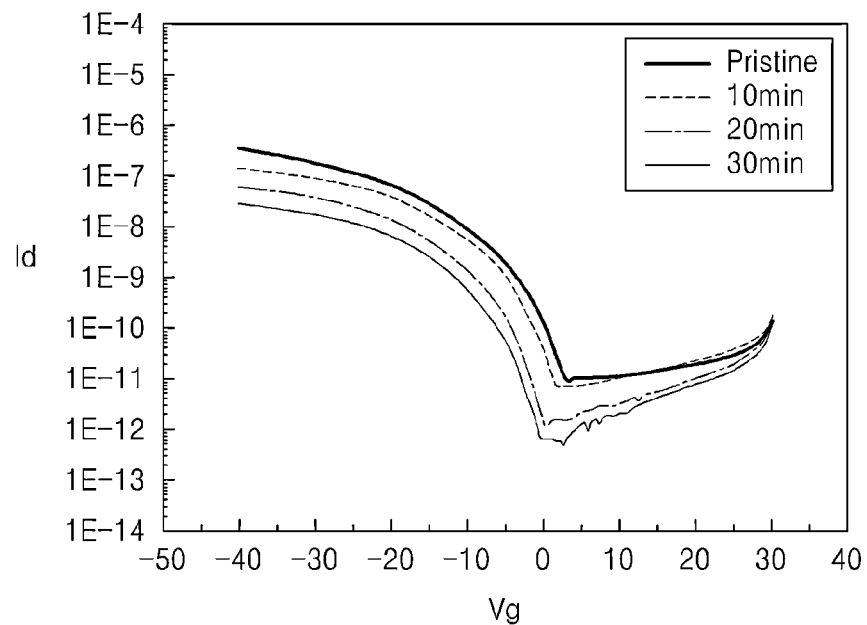
FIG. 4 represents a result of measuring transfer characteristics of a channel layer versus annealing time.

FIG. 4 illustrates a result of measuring the transfer characteristics of the channel layer as a function of time. In the measurements in FIG. 4, 4 TFTs having a channel layer were obtained using the same methods as in Example 1 but with a variation in the annealing time. As illustrated in FIG. 4, the gate voltage of a transfer curve gradually shifted negatively as the annealing time increased. However, even when the annealing time was increased, the channel layer did not show any special degradation phenomena. Hence, electric current flowed well in the channel layer and the channel layer did not lose electrical properties.

Figure 5:
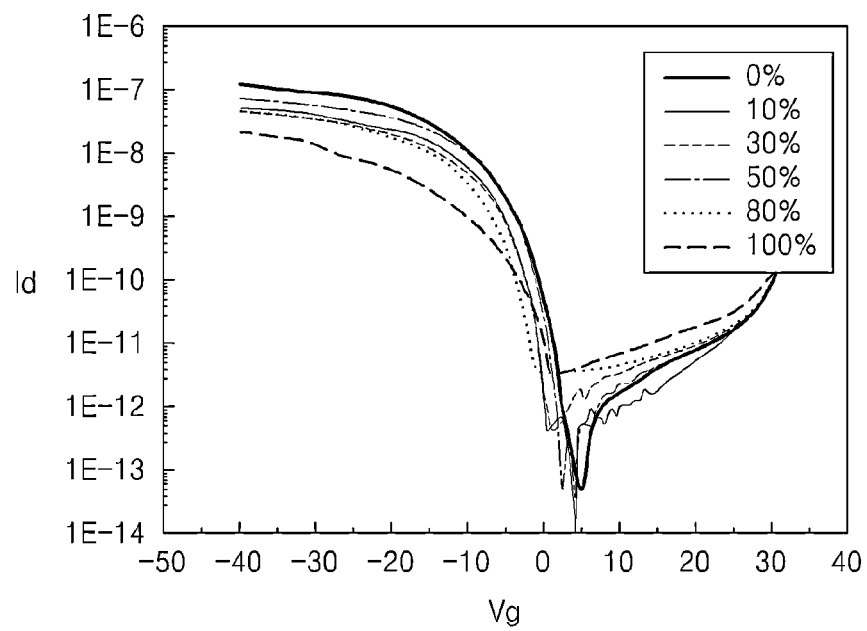
FIG. 5 represents a result of measuring transfer characteristics of a channel layer versus elongation rates.

FIG. 5 illustrates a result of measuring the transfer characteristics as a function of elongation rates. To perform the measurements in FIG. 5, numerous TFT's having channel layers were obtained using the same methods in Example 1, but were elongated at different elongation rates. As illustrated in FIG. 5, almost no change in properties were observed from an elongation rate of from about 0% to about 80%. As used herein, the phrase "almost no change in transfer characteristics occur from an elongation rate of from about 0% to about 80%" means the amount of change in transfer characteristics reflected in FIG. 5 between the 0% and 80% lines under the testing conditions reported herein. At an elongation rate of 100%, the flow of electricity started to decrease due to the limitation on the elongation rate of the channel layer.

Figure 6:
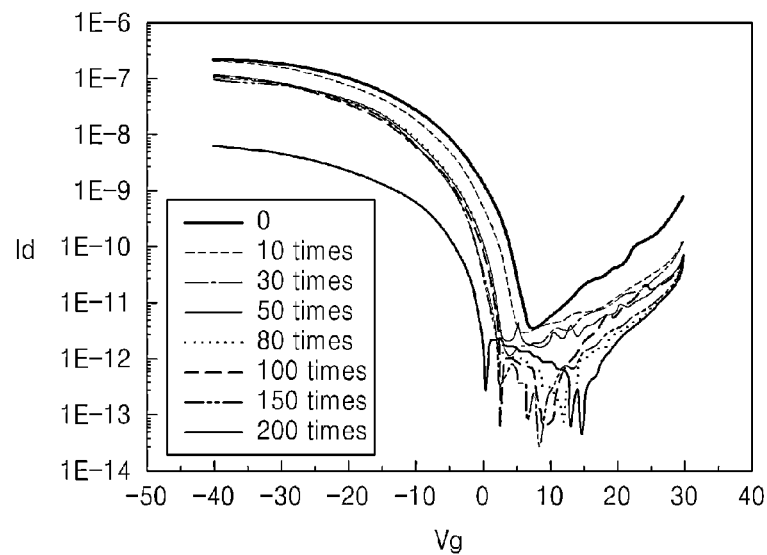
FIG. 6 represents a result of measuring transfer characteristics of a channel layer versus number of elongations.

FIG. 6 illustrates a result of measuring transfer characteristics as a function of the number of elongations. The measurements in FIG. 6 used the TFT obtained in Example 1; however, a channel layer that was cumulatively elongated was repeatedly reused. The elongation rate was 50%. Elongating once refers to elongating the channel layer up to 50% and returning back to the original size. As illustrated in FIG. 6, a big change in the transfer curve was not observed even after repetitive elongation over 150 times. After elongating 200 times, a reduction in the electric current started to occur. As used herein, the phrase "almost no change in transfer characteristics occur after elongating 150 times" means the amount of change in transfer characteristics reflected in FIG. 6 between the "0" and "150 times" lines and under the testing conditions reported herein.

Figure 7:
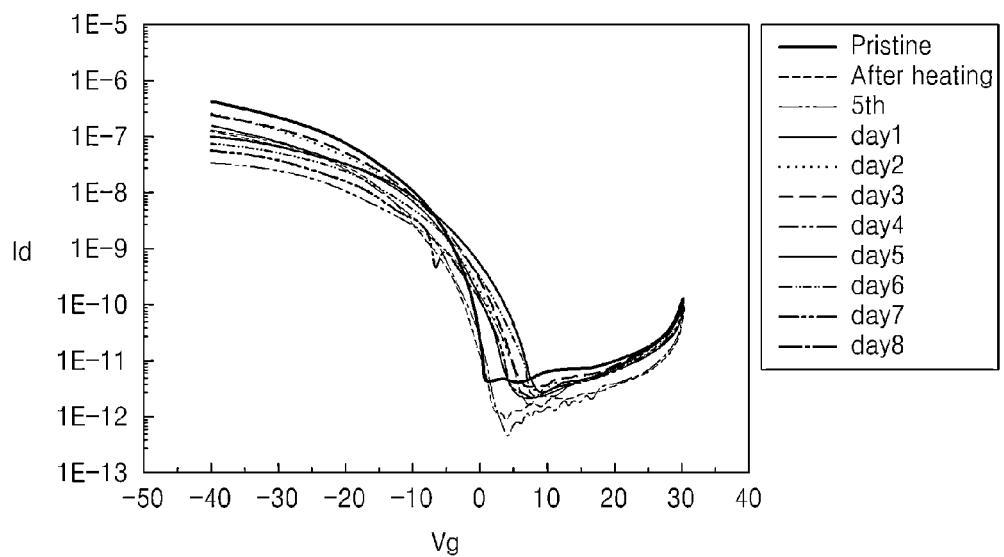
FIG. 7 represents a result of measuring transfer characteristics of the channel layer versus passage of time after manufacturing a channel layer.
Figure 8:
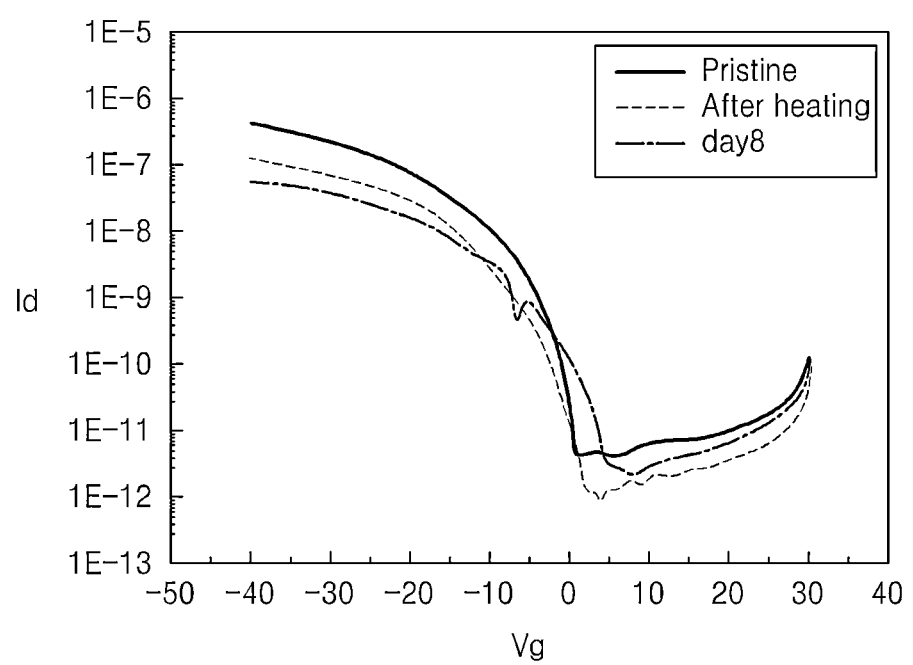
FIG. 8 is the graph of FIG. 7 showing only the "Pristine", "After heating" and "Day 8" data lines.

FIG. 7 illustrates a result of measuring transfer characteristics of the channel layer as a function of the passage of time after manufacturing the channel layer. For the measurements in FIG. 7, the TFTs obtained in Example 1 were used. Since the SEBS partially covered the P3HT and the SEBS has hydrophobicity, the channel layer is stable with respect to air and humidity. As illustrated in FIG. 7, the channel layer did not show a big change in electrical properties even eight days after the manufacturing date. As used herein, the phrase "almost no change in transfer characteristics occur after eight days after the manufacturing date" means the amount of change in transfer characteristics reflected in FIG. 7 between the "After heating" and "day 8" lines and under the testing conditions reported herein.

It should be understood that the exemplary embodiments described herein should be considered to be descriptive only and do not limit the inventive concept. Descriptions of features or aspects within each embodiment should typically be considered as being available for other similar features or aspects in other embodiments.

What is claimed is:

1. A material for forming a channel layer for a stretchable thin film transistor, the material comprising an elastomer, an organic semiconductor material and a solvent, wherein the organic semiconductor material is selected from the group consisting of poly(3-hexylthiophene-2,5-diyl) (P3HT), poly(quaterthiophene) (PQT), poly(2,5-bis(3-alkylthiophen-2-yl)thieno[3,2-b]thiophene) (PBTTT), poly[bis(4-phenyl)(2,4,6-trimethylphenyl)amine] (PTAA), 6,13-bis(triisopropylsilyethylnyl)pentacene (TIPS pentacene), and combinations thereof.

2. The material for forming the channel layer for the stretchable thin film transistor of claim 1, wherein the elastomer is selected from the group consisting of a polybutadiene (PB), a styrene-butadiene copolymer, a styrene-ethylene-butylene-styrene copolymer (SEBS), an ethylene propylene diene rubber (EPDM), an acrylic rubber, a polychloroprene rubber (CR), a polyurethane (PU), a fluoro-rubber, a butyl rubber, and combinations thereof.

3. The material for forming the channel layer for the stretchable thin film transistor of claim 1, wherein a weight average molecular weight of the elastomer is from about 65,470 g/mol to about 172,300 g/mol.

4. The material for forming the channel layer for the stretchable thin film transistor of claim 1, wherein the solvent is selected from the group consisting of chloroform, chlorobenzene, toluene, dimethylformaldehyde, tetrahydrofuran, dimethyl sulfoxide, N-methylpyrrolidone, xylene, and combinations thereof.

5. The material for forming the channel layer for the stretchable thin film transistor of claim 1, wherein an amount of the elastomer in the material for forming the channel layer for the stretchable thin film transistor is from about 0.1 parts by weight to about 1 part by weight based on 100 parts by weight of the organic semiconductor material.

6. The material for forming the channel layer for the stretchable thin film transistor of claim 1, wherein an amount of the solvent in the material for forming the channel layer for the stretchable thin film transistor is from about 98.00 parts by weight to about 98.75 parts by weight based on 100 parts by weight of the total weight of the organic semiconductor material and the elastomer.

7. The material for forming the channel layer for the stretchable thin film transistor of claim 1, wherein a viscosity of the material for forming the channel layer for the stretchable thin film transistor is from about 1.08 cps to about 2.0 cps.

8. A channel layer for a stretchable thin film transistor, the channel layer comprising an elastomer matrix and an organic semiconductor material network, wherein the organic semiconductor material network is present at least on a surface of the elastomer matrix, wherein the organic semiconductor material is selected from the group consisting of poly(3-hexylthiophene-2,5-diyl) (P3HT), poly(quaterthiophene) (PQT), poly(2,5-bis(3-alkylthiophen-2-yl)thieno[3,2-b]thiophene) (PBTTT), poly[bis(4-phenyl)(2,4,6-trimethylphenyl)amine] (PTAA), 6,13-bis(triisopropylsilyethylnyl)pentacene (TIPS pentacene), and combinations thereof.

9. The channel layer for the stretchable thin film transistor of claim 8, wherein the elastomer is selected from the group consisting of a polybutadiene (PB), a styrene-butadiene copolymer, a styrene-ethylene-butylene-styrene copolymer (SBS), a styrene-ethylene-butylene-styrene copolymer (SEBS), an ethylene propylene diene rubber (EPDM), an acrylic rubber, a polychloroprene rubber (CR), a polyurethane (PU), a butyl rubber, and combinations thereof.

10. The channel layer for the stretchable thin film transistor of claim 8, wherein a weight average molecular weight of the elastomer is from about 65,470 g/mol to about 172,300 g/mol.

11. The channel layer for the stretchable thin film transistor of claim 8, wherein an amount of the elastomer in the channel layer for the stretchable thin film transistor is from about 0.1 parts by weight to about 1 part by weight based on 100 parts by weight of the organic semiconductor material.

12. The channel layer for the stretchable thin film transistor of claim 8, wherein a thickness of the channel layer is from about 0.02 μm to about 0.05 μm.

13. The channel layer for the stretchable thin film transistor of claim 8, having a property in which almost no change in transfer characteristics occur from an elongation rate of from about 0% to about 80%.

14. The channel layer for the stretchable thin film transistor of claim 8, having a property in which almost no change in transfer characteristics occur after elongating 150 times.

15. The channel layer for the stretchable thin film transistor of claim 8, having a property in which almost no change in transfer characteristics occur after eight days after the manufacturing date.

16. A thin film transistor comprising an elastomer matrix and a channel layer comprising an elastomer matrix and an organic semiconductor material network present at least on a surface of the elastomer matrix wherein the organic semiconductor material is selected from the group consisting of poly(3-hexylthiophene-2,5-diyl) (P3HT), poly(quaterthiophene) (PQT), poly(2,5-bis(3-alkylthiophen-2-yl)thieno[3,2-b]thiophene) (PBTTT), poly[bis(4-phenyl)(2,4,6-trimethylphenyl)amine] (PTAA), 6,13-bis(triisopropylsilyethylnyl) pentacene (TIPS pentacene), and combinations thereof.

\* \* \* \* \*